United States Patent
Lee et al.

(10) Patent No.: US 8,304,854 B2
(45) Date of Patent: Nov. 6, 2012

(54) SEMICONDUCTOR INTEGRATED CIRCUIT CHIP, MULTILAYER CHIP CAPACITOR AND SEMICONDUCTOR INTEGRATED CIRCUIT CHIP PACKAGE

(75) Inventors: Byoung Hwa Lee, Gyunggi-do (KR); Min Cheol Park, Gyunggi-do (KR); Ho Cheol Kwak, Clemson, SC (US); Haixin Ke, Clemson, SC (US); Todd Harvey Hubing, Clemson, SC (US)

(73) Assignees: Samsung Electro-Mechanics Co., Ltd., Gyunggi-Do (KR); Clemson University, Clemson, SC (US)

( * ) Notice: Subject to any disclaimer, the term of this patent is extended or adjusted under 35 U.S.C. 154(b) by 327 days.

(21) Appl. No.: 12/270,457

(22) Filed: Nov. 13, 2008

(65) Prior Publication Data

US 2010/0117192 A1   May 13, 2010

(51) Int. Cl.
*H01L 29/92* (2006.01)
(52) U.S. Cl. ............ 257/532; 361/301.1; 361/306.1; 361/306.2; 361/306.3; 361/307; 361/308.1; 361/310; 361/734; 361/738; 257/535; 257/E23.057; 257/E29.343
(58) Field of Classification Search .............. 257/532, 257/535, E23.057, E29.343, 301.1, 306.1, 257/306.2, 306.3, 307, 308, 310, 734, 738
See application file for complete search history.

(56) References Cited

U.S. PATENT DOCUMENTS

| 5,387,814 | A  * | 2/1995  | Baudouin et al. ............ 257/690 |
| 6,222,246 | B1 * | 4/2001  | Mak et al. ..................... 257/532 |
| 6,964,584 | B2 * | 11/2005 | Zhong et al. ............. 439/620.21 |
| 7,319,268 | B2 * | 1/2008  | Watanabe et al. ............ 257/686 |
| 2002/0074643 | A1 * | 6/2002 | Yamazaki et al. ............ 257/692 |
| 2003/0234434 | A1 | 12/2003 | Matsushima |
| 2006/0097365 | A1 * | 5/2006 | Song et al. .................... 257/666 |
| 2008/0258259 | A1 | 10/2008 | Osaka et al. |
| 2008/0266031 | A1 | 10/2008 | Uematsu et al. |

FOREIGN PATENT DOCUMENTS

| JP | 59-124744 A | 7/1984 |
| JP | 59-185821 U | 12/1984 |
| JP | 63-158828 A | 7/1988 |
| JP | 06-283384 A | 10/1994 |

(Continued)

OTHER PUBLICATIONS

IBM Technical Description Bulletin, DOc. ID : NN80044919, "Decoupling Capacitor Implementation Scheme", Apr. 1980.*

(Continued)

*Primary Examiner* — Matthew Reames
*Assistant Examiner* — Ermias Woldegeorgis
(74) *Attorney, Agent, or Firm* — McDermott Will & Emery LLP

(57) ABSTRACT

Disclosed are a semiconductor integrated circuit chip, a multilayer chip capacitor, and a semiconductor integrated circuit chip package. The semiconductor integrated circuit chip includes a semiconductor integrated circuit chip body, an input/output terminal disposed on the outside of the semiconductor integrated circuit chip body, and a decoupling capacitor disposed at a side face of the semiconductor integrated circuit chip body and electrically connected to the input/output terminal. The semiconductor integrated circuit chip cab be obtained, which can maintain an impedance of a power distribution network below a target impedance in a wide frequency range, particularly at a high frequency, by minimizing an inductance between a decoupling capacitor and a semiconductor integrated circuit chip.

27 Claims, 7 Drawing Sheets

FOREIGN PATENT DOCUMENTS

| | | | |
|---|---|---|---|
| JP | 11-176694 | A | 7/1999 |
| JP | 2000306764 | A * | 11/2000 |
| JP | 2002164462 | A | 6/2002 |
| JP | 2004-031432 | A | 1/2004 |
| JP | 2006-086359 | A | 3/2006 |
| JP | 2006-278355 | A | 12/2006 |
| JP | 2007-173669 | | 7/2007 |
| JP | 2007-243229 | | 9/2007 |
| JP | 2008-004853 | | 1/2008 |
| JP | 2008-258312 | A | 10/2008 |
| JP | 2008-270581 | A | 11/2008 |

OTHER PUBLICATIONS

Japanese Office Action, with English translation, issued in Japanese Patent Application No. 2009-149505, dated Jun. 27, 2011.

Japanese Office Action, w/ English translation thereof, issued in Japanese Patent Application No. 2009-149505, dated Dec. 6, 2011.

Japanese Office Action, and English translation thereof, issued in Japanese Patent Application No. 2009-149505 dated Jul. 10, 2012.

* cited by examiner

SEMICONDUCTOR INTEGRATED CIRCUIT CHIP, MULTILAYER CHIP CAPACITOR AND SEMICONDUCTOR INTEGRATED CIRCUIT CHIP PACKAGE

BACKGROUND OF THE INVENTION

1. Field of the Invention

The present invention relates to a semiconductor integrated circuit chip, a multilayer chip capacitor and a semiconductor integrated circuit chip package.

2. Description of the Related Art

A semiconductor integrated circuit chip such as a micro processor unit (MPU) chip is continuously increasing in operating frequency, and the integration density thereof is also increasing. For this reason, current consumption of the semiconductor integrated circuit chip is continuously increased, and its operation voltage is lowered. Thus, it becomes more difficult to suppress noise of a DC supply voltage, which occurs due to a sudden fluctuation of a load current of the semiconductor integrated circuit chip.

That is, as can be seen from the following equation, the target impedance ($Z_{target}$) is being gradually lowered.

$$Z_{target} = Vp \times AR/I = Vr/I$$

where Vp represents a power voltage, AR represents an allowed ripple, I represents a current consumed by an MPU, and Vr represents an allowed ripple voltage.

In general, the allowed ripple voltage (Vr) ranges from about 5% to about 10% of a power voltage. The target impedance ($Z_{target}$) must be met not just at a DC current (DC) but also at every frequency at which a transient current exists. In the case of a personal computer (PC) or a notebook computer, a transient current exists even in the very high frequency range because of the use of high-speed semiconductor integrated circuits, i.e., high-speed central processing units (CPUs). Thus, the target impedance must be satisfied even in a wide frequency range.

A decoupling capacitor can remove the voltage noise by supplying a current to the semiconductor integrated circuit chip at the time of the sudden fluctuation of the load current. However, even with the decoupling capacitor, it is not easy to meet the target impedance even at a high frequency. Therefore, there is a need for a method for maintaining an impedance of a power distribution network below the target impedance in a wide frequency range, particularly at the high frequency.

SUMMARY OF THE INVENTION

An aspect of the present invention provides a semiconductor integrated circuit chip capable of maintaining an impedance of a power distribution network below a target impedance in a wide frequency range, particularly at a high frequency, by minimizing an inductance between a decoupling capacitor and a semiconductor integrated circuit chip.

An aspect of the present invention also provides a multilayer chip capacitor that can be used for the semiconductor integrated circuit chip, and a package including the semiconductor integrated circuit chip.

According to an aspect of the present invention, there is provided a semiconductor integrated circuit chip including: a semiconductor integrated circuit chip body; an input/output terminal disposed on the outside of the semiconductor integrated circuit chip body; and a decoupling capacitor disposed at a side face of the semiconductor integrated circuit chip body and electrically connected to the input/output terminal.

The input/output terminal may be placed at the side face of the semiconductor integrated circuit chip body at which the decoupling capacitor is disposed. The input/output terminal may be disposed on at least one of top and bottom faces of the semiconductor integrated circuit chip body.

The decoupling capacitor may be a multilayer chip capacitor, which includes a capacitor body including therein a stack of a plurality of dielectric layers; first and second internal electrodes having opposite polarity and alternated with each other, with the dielectric layer between each alternate set of the first and second internal electrodes; and first and second external electrodes disposed on the outside of the capacitor body and respectively connected to the first and second internal electrodes.

The first and second external electrodes may be disposed in one direction on a side face of the capacitor body facing the semiconductor integrated circuit chip body, and are spaced apart from each other.

The input/output terminal may include first and second electrode pads for electrical connection with the first and second external electrodes, respectively.

The first and second electrode pads may be disposed on both top and bottom faces of the semiconductor integrated circuit chip body.

The first and second electrode pads on the same face may be spaced apart from each other in a direction perpendicular to a direction from the semiconductor integrated circuit chip body toward the decoupling capacitor.

The second electrode pad on the bottom face of the semiconductor integrated circuit chip body may face the first electrode pad on the top face of the semiconductor integrated circuit chip body. The plurality of dielectric layers may be stacked in the same direction as a direction in which the first and second electrode pads are disposed.

The first and second electrode pads may be disposed on a top or bottom face of the semiconductor integrated circuit chip body. The first and second electrode pads may be spaced apart from each other in a direction from the semiconductor integrated circuit chip body toward the decoupling capacitor.

According to another aspect of the present invention, there is provided a multilayer chip capacitor including: a capacitor body having a shape defined by top and bottom faces facing each other and a side face therebetween, and having therein a stack of a plurality of dielectric layers; first and second internal electrodes having opposite polarity and alternated with each other, with the dielectric layer between each alternate set of the first and second internal electrodes; and first and second external electrodes disposed on the outside of the capacitor body and electrically connected to the first and second internal electrodes, respectively. The capacitor body includes at least one protrusion extending from one side face of the capacitor body, and the first and second external electrodes are disposed on at least one of faces forming the protrusion.

The capacitor body may include one protrusion extending from the top face and the side face of the capacitor body. The first and second external electrodes may be disposed on a face facing a lower portion of the capacitor body among faces forming the protrusion. The first and second external electrodes may be spaced apart from each other in a direction from the protrusion toward the capacitor body. The plurality of dielectric layers may be stacked in a direction perpendicular to a direction in which the first and second external electrodes are disposed.

The capacitor body may include a first protrusion extending from the top face and the side face of the capacitor body, and a second protrusion extending from the bottom face and the side face of the capacitor body. The first and second external electrodes may be disposed on a face facing a lower portion of the capacitor body among faces forming the first protrusion and on a face facing an upper portion of the capacitor body among faces forming the second protrusion.

The first and second external electrodes at the first protrusion may be spaced from each other in a direction perpendicular to a direction from the first protrusion toward the capacitor body. The first and second external electrodes at the second protrusion may be spaced apart from each other in a direction perpendicular to a direction from the second protrusion toward the capacitor body. The second external electrode at the second protrusion may face the first external electrode at the first protrusion. The plurality of dielectric layers may be stacked in a direction in which the first and second external electrodes are disposed.

The capacitor body may include a plurality of protrusions disposed in one direction and spaced apart from each other.

According to another aspect of the present invention, there is provided a semiconductor integrated circuit chip package including: a package substrate; and a semiconductor integrated circuit chip mounted on the package substrate and including a semiconductor integrated circuit chip body, an input/output terminal disposed on the outside of the semiconductor integrated circuit chip body, and a decoupling capacitor disposed at a side face of the semiconductor integrated circuit chip body and electrically connected to the input/output terminal.

The semiconductor integrated circuit chip may include a plurality of semiconductor integrated circuit chips stacked on top of each other on the package substrate.

The decoupling capacitor may be a common decoupling capacitor electrically connected to at least two semiconductor integrated circuit chips of the plurality of semiconductor integrated circuit chips.

The decoupling capacitor may include: at least one protrusion extending from a side face of the decoupling capacitor facing the semiconductor integrated circuit chip body; and first and second external electrodes disposed at a face forming the protrusion and electrically connected to the input/output terminal.

The protrusion may be placed in a space between an adjacent set of the semiconductor integrated circuit chips.

The semiconductor integrated circuit chip package may further include an external electrode provided on one side of the decoupling capacitor and contacting a top face of the package substrate to be electrically connected with the package substrate. The semiconductor integrated circuit chip body may be electrically connected with the package substrate through the decoupling capacitor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
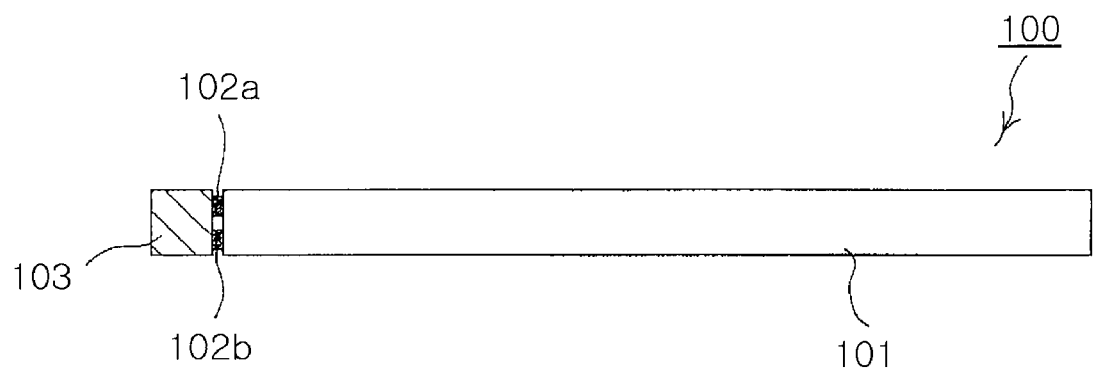
FIG. 1A is a cross-sectional view of a semiconductor integrated circuit chip according to an exemplary embodiment of the present invention.

Exemplary embodiments of the present invention will now be described in detail with reference to the accompanying drawings.

The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions and shapes of elements are exaggerated for clarity of illustration. Like reference numerals refer to like elements throughout.

Figure 1B:
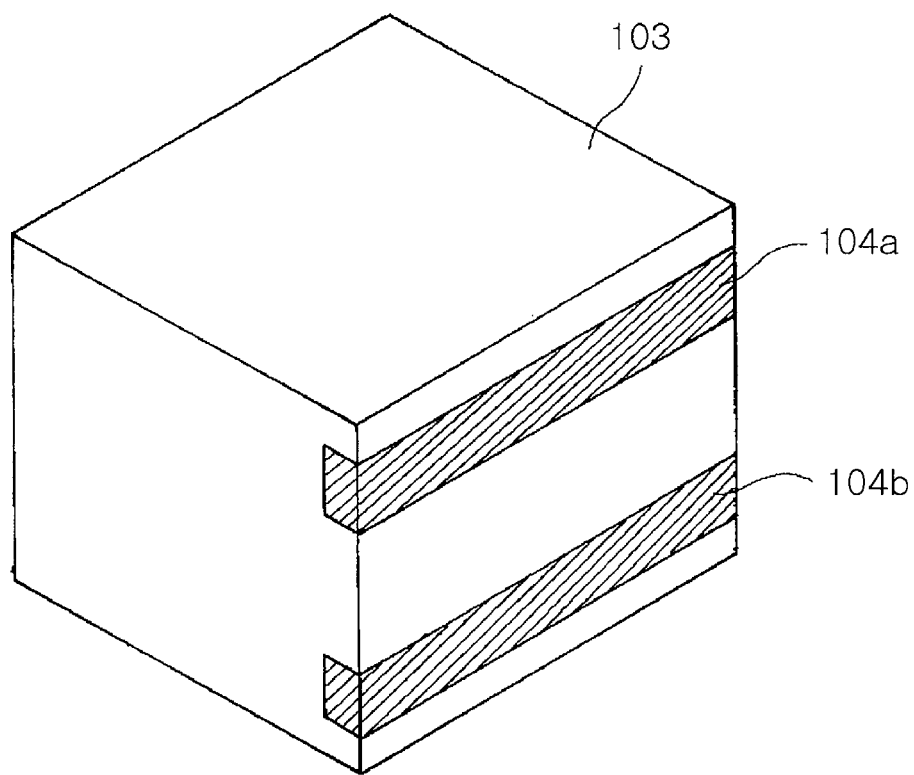
FIG. 1B is a perspective view of a decoupling capacitor disposed at a side face of the semiconductor integrated circuit chip of FIG. 1A.
Figure 1C:
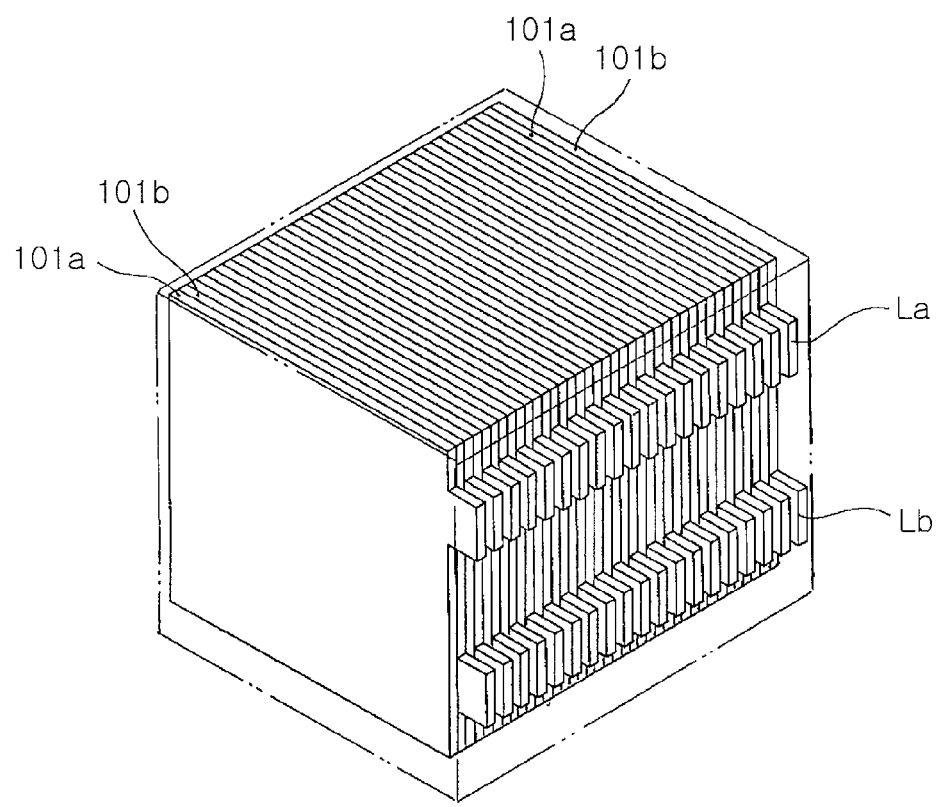
FIG. 1C is a view of the interior of a capacitor body of the decoupling capacitor of FIG. 1B.

FIGS. 1A through 1C are views for explaining a semiconductor integrated circuit chip according to an exemplary embodiment of the present invention. FIG. 1A is a cross-sectional view, and FIG. 1B is a perspective view of a decoupling capacitor disposed at a side face of the semiconductor integrated circuit. FIG. 1C illustrates the interior of a capacitor body of the decoupling capacitor of FIG. 1B.

Referring to FIG. 1A, a semiconductor integrated circuit chip 100 according to the current embodiment of the present invention includes a semiconductor integrated circuit chip body 101, input/output terminals 102a and 102b serving as first and second electrode pads, and a decoupling capacitor 103 disposed at a side face of the semiconductor integrated circuit chip body 101. The semiconductor integrated circuit chip body 101 can be used as a central processing unit (CPU) of e.g., a computer and a portable terminal by including therein a logic circuit that can process predetermined information. For example, the semiconductor integrated circuit chip body 101 corresponds to a micro processing unit (MPU) chip. In this case, the semiconductor integrated circuit chip body 101 may be electrically connected to the decoupling capacitor 103 by the input/output terminals 102a and 102b disposed at its side face, i.e., the first and second electrode pads 102a 102b of opposite polarity.

The decoupling capacitor 103 applies a current to the semiconductor integrated circuit chip body 101 at the time of a sudden fluctuation of a load current. Thus, the decoupling capacitor 103 can serve to prevent a defective operation of the semiconductor integrated circuit chip body 101, which is caused by the fluctuation of a power voltage or high-frequency noise. As will be described later, the decoupling capacitor 103 disposed directly at the side face of the semiconductor integrated circuit chip body 101 contributes to lowering an inductance at a current path with the semiconductor integrated circuit chip body 101.

Referring to FIGS. 1B and 1C, the decoupling capacitor 103 includes a capacitor body having a hexahedron shape, and first and second external electrodes 104a and 104b disposed on the outside of the capacitor body. The first and second external electrodes 104a and 104b are electrically connected to the first and second electrode pads 102a and 102b of FIG. 1A, respectively. For this electrical connection, as shown in FIG. 1B, the first and second external electrodes 104a and 104b are formed on one side face facing the semiconductor integrated circuit chip body 101 among side faces of the capacitor body. This structure facilitates disposition of the decoupling capacitor 103 at the side face of the semiconductor integrated circuit chip body 101.

According to the current embodiment, the capacitor body includes a stack of a plurality of dielectric layers. That is, the decoupling capacitor 103 may be a multilayer chip capacitor (MLCC). In the decoupling capacitor 103, first and second internal electrodes 101a and 101b are alternated with each other, with the dielectric layer located between each alternate set of the first and second internal electrodes 101a and 101b. In FIG. 1C, just the first and second internal electrodes 101a and 101b are illustrated for the convenience of illustration, but the dielectric layer may be considered to be placed between each alternate set of the first and second internal electrodes 101a and 101b. The first internal electrode 101a includes a lead structure La for connection with the first external electrode 104a. The second internal electrode 101b also includes a lead structure Lb for connection with the second external electrode 104a. Particularly, as shown in FIG. 1C, the first and second internal electrodes 101a and 101b respectively include the lead structures La and Lb extending in the same direction.

The decoupling capacitor 103 is connected directly to the semiconductor integrated circuit chip body 101 to form one structure. In this application, such a structure is referred to as the semiconductor integrated circuit chip 100. Thus, a current path between the decoupling capacitor 103 and the semiconductor integrated circuit chip body 101 can be very short. If a decoupling capacitor is disposed at a package substrate where a semiconductor integrated circuit chip is mounted, or a mother board for power supply, a current path is relatively elongated between the decoupling capacitor and the semiconductor integrated circuit chip (or a semiconductor integrated circuit chip body). This makes it difficult to make an inductance between the decoupling capacitor and the semiconductor integrated circuit chip below a target value. Difficulties associated with the inductance may become worse at a high frequency of hundreds of MHz or higher. As a result, it may become difficult to meet the target impedance condition.

According to the current embodiment, the decoupling capacitor 103 is disposed directly at the side face of the semiconductor integrated circuit chip body 101, so that the current path between the two can be minimized. Accordingly, an inductance can be minimized between the decoupling capacitor 103 and the semiconductor integrated circuit chip body 101. If the decoupling capacitor 103 is disposed on the bottom or the like of the semiconductor integrated circuit chip body 101, spatial limitations occur when it is mounted on a package substrate. This is because a plurality of input/output terminals (not shown) are disposed normally at the bottom of the semiconductor integrated circuit chip body 101. Thus, the size of the decoupling capacitor might be limited. As in the current embodiment, the direct disposition of the decoupling capacitor 103 at the side face does not cause such limitation.

Figure 2A:
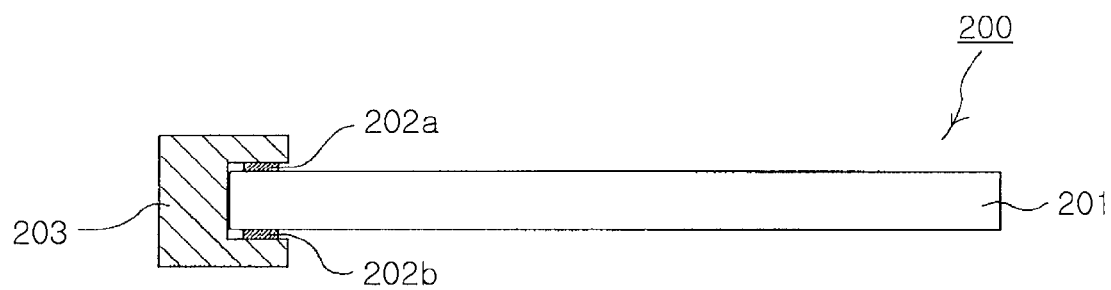
FIG. 2A is a cross-sectional view of a semiconductor integrated circuit chip according to another exemplary embodiment of the present invention.
Figure 2B:
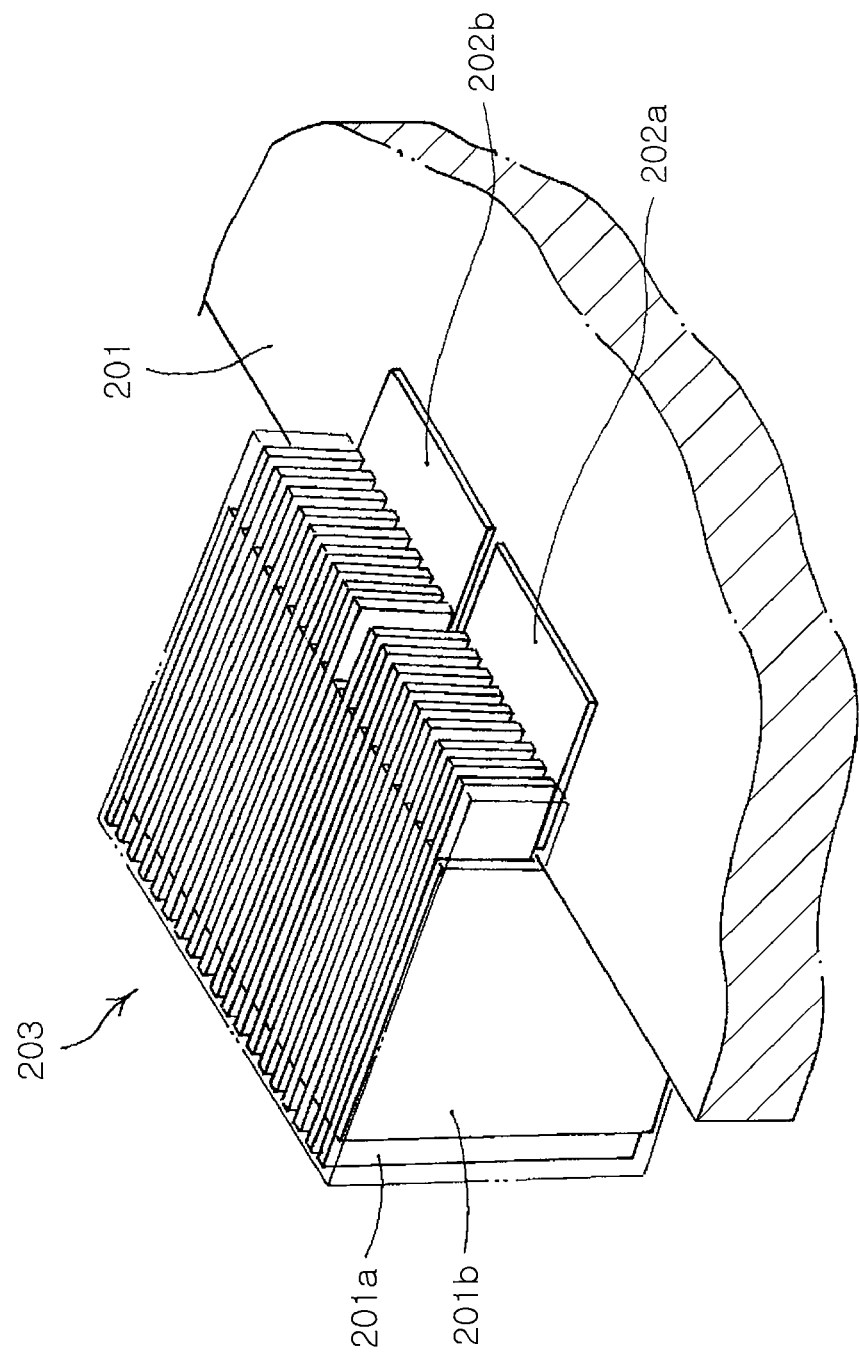
FIGS. 2B and 2C are perspective views illustrating the disposition of a decoupling capacitor at a semiconductor integrated circuit chip body of FIG. 2A.
Figure 2C:
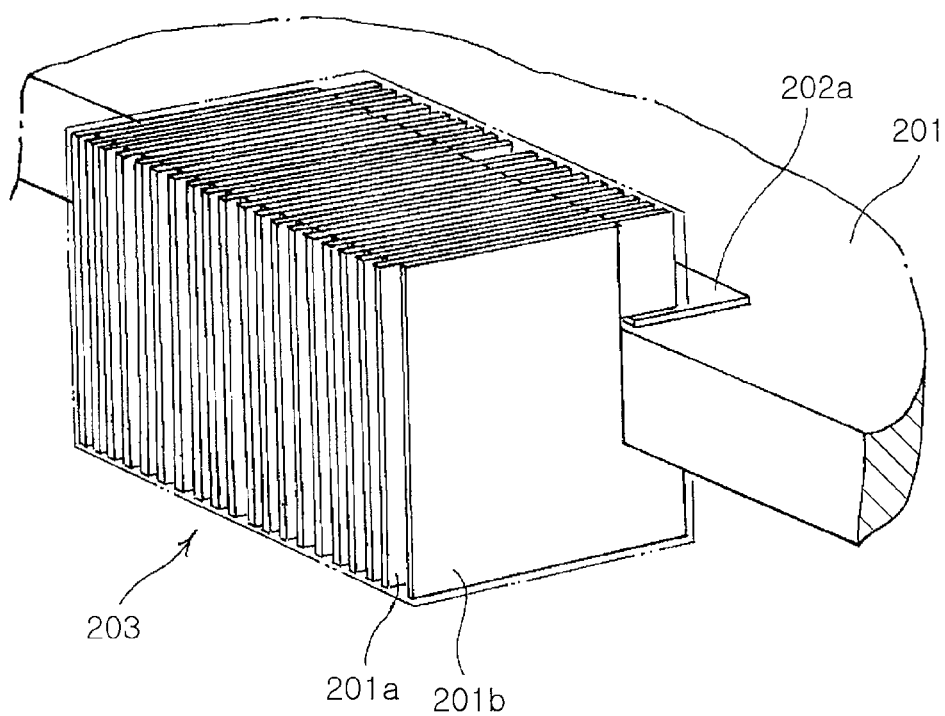

FIGS. 2A through 2C are views for explaining a semiconductor integrated circuit chip according to another exemplary embodiment of the present invention. FIG. 2A is a cross-sectional view, and FIGS. 2B and 2C are perspective views illustrating the disposition of a decoupling capacitor at a semiconductor integrated circuit chip body in detail.

The current embodiment of FIG. 2A is similar to the previous embodiment of FIGS. 1A to 1C in that a semiconductor integrated circuit chip 200 according to the current embodiment includes a semiconductor integrated circuit chip body 201, first and second electrode pads 202a and 202b, and a decoupling capacitor 203 disposed at a side face of the semiconductor integrated circuit chip body 201. The difference there is that the first and second electrode pads 202a and 202b are not disposed at a side face of the semiconductor integrated circuit chip body 201, and thus the decoupling capacitor 203 has a clip-like structure, not a hexahedron structure. This will now be described in more detail with reference to FIGS. 2B and 2C. The first and second electrode pads 202a and 202b are disposed on both top and bottom faces of the semiconductor integrated circuit chip body 201. The decoupling capacitor 203 includes two protrusions respectively protruding from an upper portion and a lower portion thereof. As a result, the decoupling capacitor 203 may be attached to the semiconductor integrated circuit chip body 201 as a clip-like shape. The decoupling capacitor 203 can be more firmly attached to the semiconductor integration circuit chip body 201 because of its clip shape.

Although not shown, first and second external electrodes may be formed on the outside of the decoupling capacitor 203 to contact the first and second electrode pads 202a and 202b, respectively. The first and second external electrodes are electrically connected to first and second internal electrodes 201a and 201b, respectively.

A structure of the decoupling capacitor 203 will now be described in more detail with reference to FIGS. 2B and 2C. As shown in FIGS. 2B and 2C, a stack direction of the first and second internal electrodes 201a and 201b, i.e., a direction in which a plurality of dielectric layers are stacked, corresponds to a direction in which the first and second electrode pads 202a and 202b are disposed. When viewed from the top of the semiconductor integrated circuit chip body 201, first internal electrodes 201a in a left region, specifically, in the left half of the decoupling capacitor 203 have lead structures extending from their upper portions, respectively. First internal electrodes 201a in the right half of the decoupling capacitor 203 have lead structures extending from their lower portions, respectively.

In this case, the respective lead structures of the first internal electrodes 201a extending from their upper portions are electrically connected to the first electrode pad 202a on a top face of the semiconductor integrated circuit chip body 201. The respective lead structures of the first internal electrodes 201a extending from their lower portions are electrically connected to a first electrode pad (not shown) on a bottom face of the semiconductor integrate circuit chip body 201. Likewise, respective lead structures of the second internal electrodes 201b extending from their upper portions are electrically connected to the second electrode pad 202b on the top face of the semiconductor integrated circuit chip body 201. Respective lead structures of the second internal electrodes 201b extending from their lower portions are electrically connected to a second electrode pad 202b on the bottom face of the semiconductor integrated circuit chip body 201.

That is, the second electrode pad 202b on the bottom face of the semiconductor integrated circuit chip body 201 faces the first electrode pad 202a on the top face of the semiconductor integrated circuit chip body 201. Likewise, the first electrode pad 202a on the bottom face of the semiconductor integrated circuit chip body 201 faces the second electrode pad 202b on the top face of the semiconductor integrated circuit chip body 201. When viewed from the top of the semiconductor integrated circuit chip body 201, the first and second electrode pads 202a and 202b overlap each other.

Figure 3A:
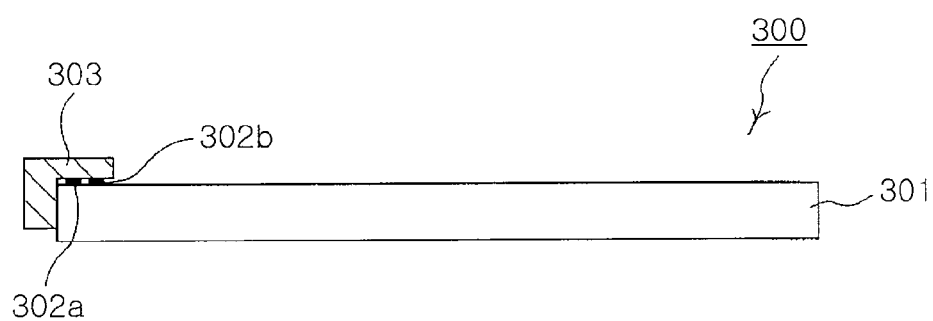
FIG. 3A is a cross-sectional view of a semiconductor integrated circuit chip according to still another exemplary embodiment of the present invention.
Figure 3B:
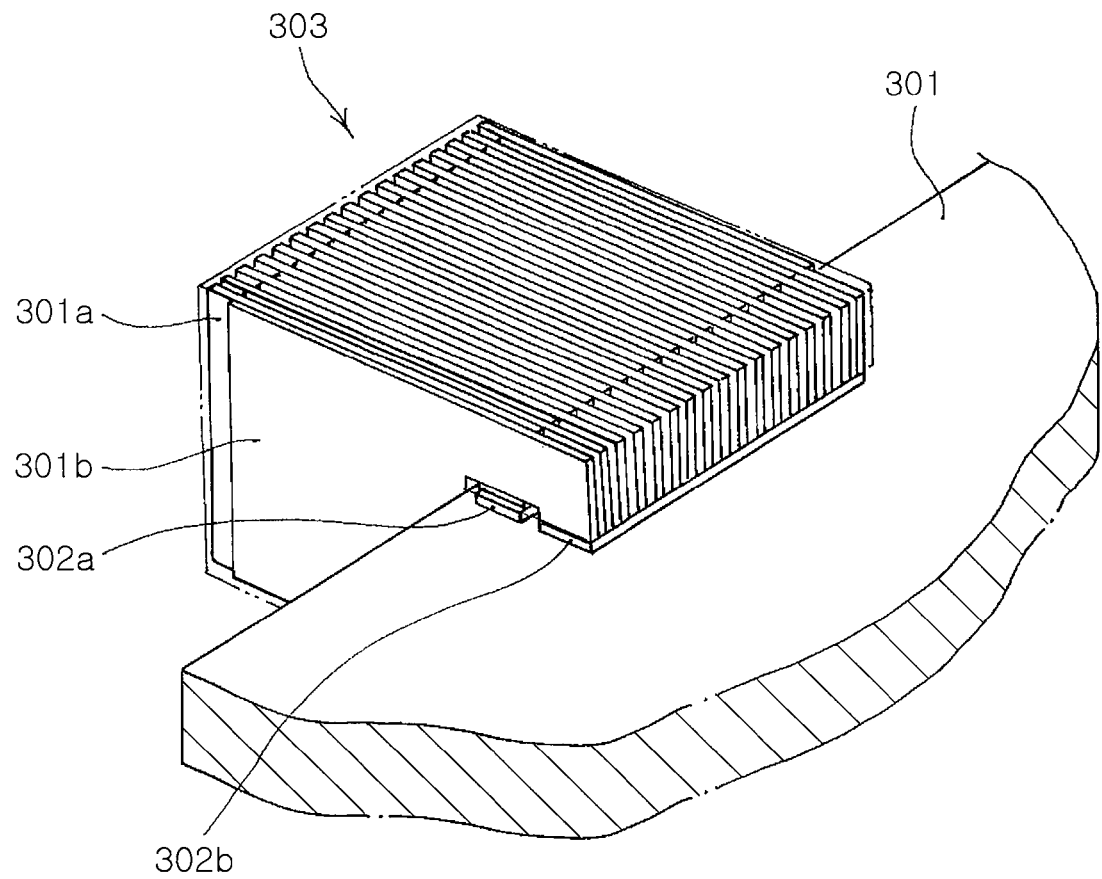
FIG. 3B is a perspective view illustrating the disposition of a decoupling capacitor at a semiconductor integrated circuit chip body of FIG. 3A.

FIGS. 3A and 3B are views for explaining a semiconductor integrated circuit chip according to still another exemplary embodiment of the present invention. FIG. 3A is a cross-sectional view, and FIG. 3B is a perspective view illustrating the disposition of a decoupling capacitor at a semiconductor integrated circuit chip body in detail.

The current embodiment of FIGS. 3A and 3B is similar to the previously embodiments of FIGS. 1A and 2A in that a semiconductor integrated circuit chip 300 according to the current embodiment includes a semiconductor integrated circuit chip body 301, first and second electrode pads 302a and 302b, and a decoupling capacitor 303 disposed at a side face of the semiconductor integrated circuit chip body 301. The difference there is that the decoupling capacitor 303 includes one protrusion protruding from an upper portion. The protrusion covers a portion of a top face of the semiconductor integrated circuit chip body 301. Also, the first and second electrode pads 302a and 302b are disposed only on the top face of the semiconductor integrated circuit chip body 301. The first and second electrode pads 302a and 302b on the top face of the semiconductor integrated circuit chip body 301 are spaced apart from each other along a direction facing the decoupling capacitor 303.

The decoupling capacitor 303 is attached to the semiconductor integrated circuit chip body 301 having the above structure. As shown in FIG. 3B, in the decoupling capacitor 303, a lead structure extending from the second internal electrode 301b is longer than a lead structure extending from the first internal electrode 301a in a direction of the semiconductor integrated device chip body 301. That is, the lead structure extending from the second internal electrode 301b covers a top portion of the first electrode pad 302a. As in the previous embodiments, first and second external electrodes may be disposed on outer portions of the decoupling capacitor 303 contacting the first and second electrode pads 302a and 302b. The description of the previous embodiments may be applied to the current embodiment of FIGS. 3A and 3B, except for the structural difference described above.

Figure 4:
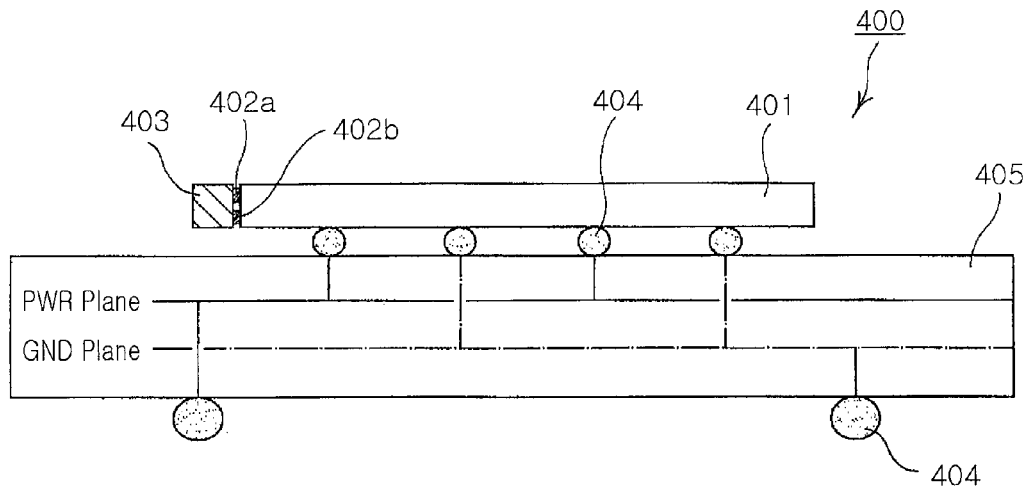
FIG. 4 is a cross-sectional view of a semiconductor integrated circuit chip package according to an exemplary embodiment of the present invention.
Figure 5:
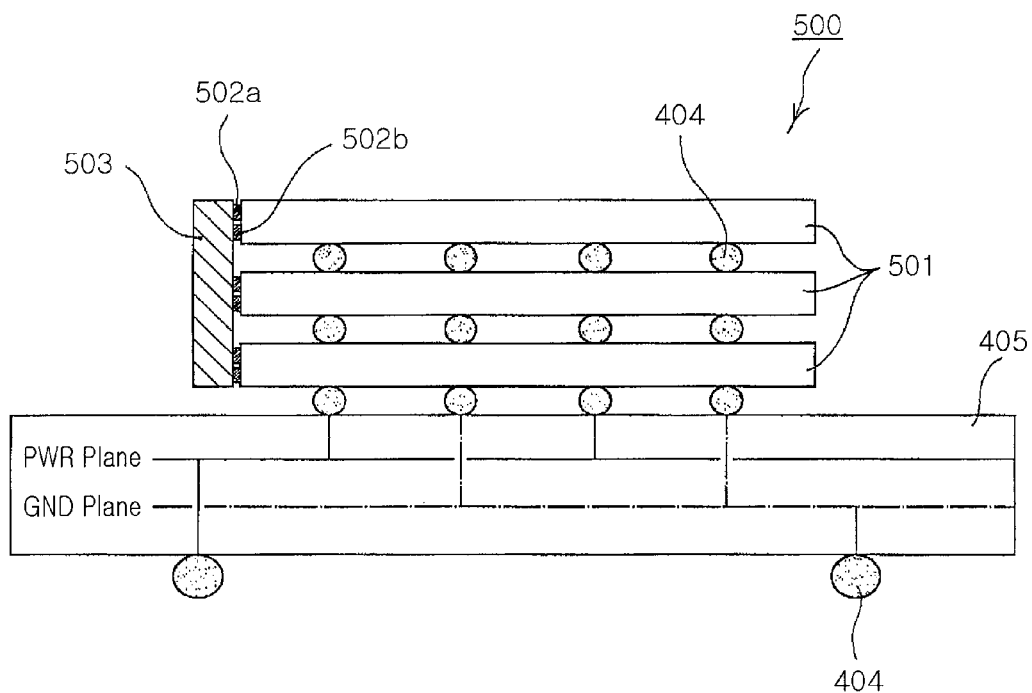
FIG. 5 is a cross-sectional view of an alternative version of the semiconductor integrated circuit chip package of FIG. 4.

Exemplary embodiments of another aspect of the present invention will now be described with reference to FIGS. 4 through 7. FIG. 4 is a cross-sectional view of a semiconductor integrated circuit chip package according to an exemplary embodiment of the present invention. FIG. 5 is an alternative version of the semiconductor integrated circuit chip package of FIG. 4.

As shown in FIG. 4, a semiconductor integrated circuit chip package 400 according to an exemplary embodiment of the present invention includes the same semiconductor integrated circuit chip as that of the embodiment of FIG. 1A. That is, the semiconductor integrated circuit chip mounted on a package substrate 405 includes a semiconductor integrated circuit chip body 401, first and second electrode pads 402a and 402b disposed at a side face of the semiconductor integrated circuit chip body 401, and a decoupling capacitor 403 electrically connected to the first and second electrode pads 402a and 402b. As shown in FIG. 4, interconnections such as a power plane PWR Plane, a ground plane GND plane and a conductive via are located on and inside the package substrate 405 in order to supply power to the semiconductor integrated circuit chip body 401. The power plane and the ground plane of the package substrate 405 may be electrically connected to the semiconductor integrated circuit chip through a via and a bump 404. As in the current embodiment, the decoupling capacitor 403 is disposed at a side face of the semiconductor integrated circuit chip body 401, so that a current path between the two can be significantly shortened, and an inductance can be lowered as compared to when the decoupling capacitor 403 is disposed at, e.g., a package substrate 405 or a mother board (not shown).

According to embodiments, a plurality of semiconductor integrated circuit chips may be provided and stacked, electrically connected together by the bump 404 or the like. As shown in FIG. 5, three semiconductor integrated circuit chip bodies 501 are stacked on the semiconductor integrated circuit chip package 500 and share a decoupling capacitor 503 located at their side faces. That is, the decoupling capacitor 503 may serve as a common decoupling capacitor of the semiconductor integrated circuit chip bodies 501.

As in the previous embodiments, the decoupling capacitor 503 is electrically connected to first and second electrode pads 502a and 502b. For this electrical connection, six external electrodes (not shown) are located on one face of the decoupling capacitor 503 facing the semiconductor integrated circuit chip body 501. According to the current embodiment, the stack of the semiconductor integrated circuit chips secure high performance and lower the inductance by sharing the one decoupling capacitor 503 located on their side faces. According to the current embodiment, the three semiconductor integrated circuit chip bodies 501 share the one decoupling capacitor 503. However, the present invention is not limited thereto, and the semiconductor integrated circuit chip bodies 501 may make one-to-one connections with decoupling capacitors.

Figure 6:
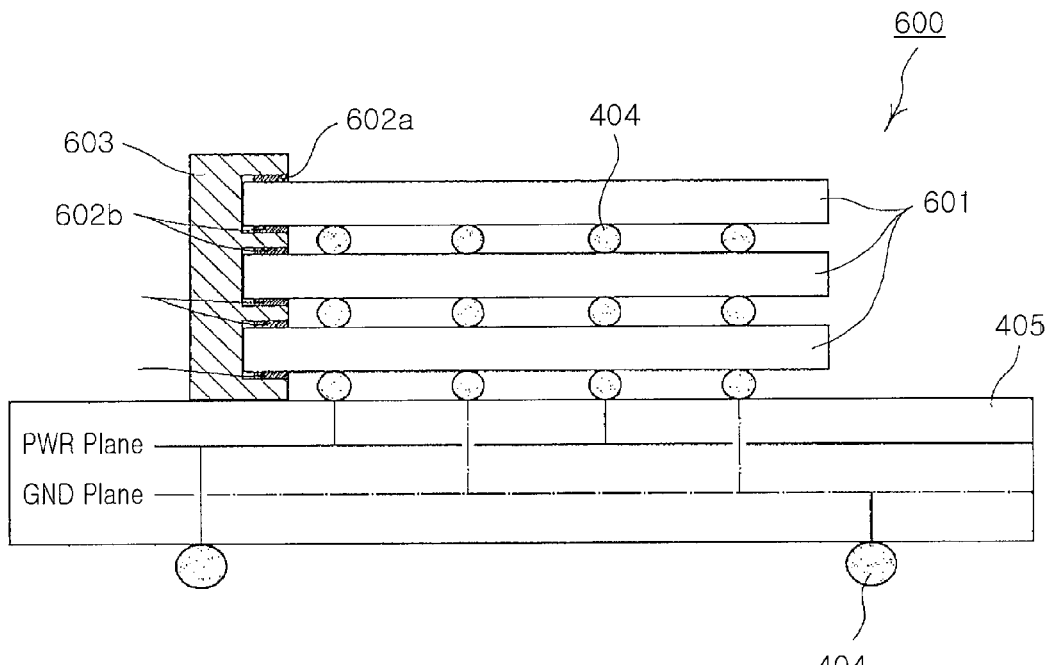
FIG. 6 is a cross-sectional view of a semiconductor integrated circuit chip package according to another exemplary embodiment of the present invention.
Figure 7:
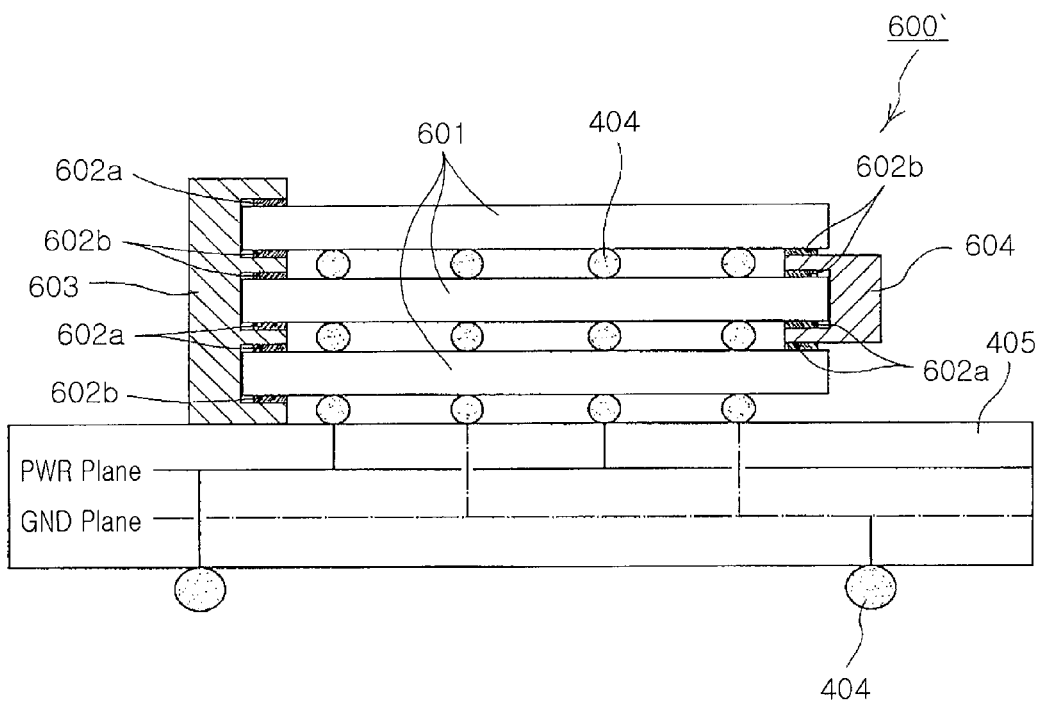
FIG. 7 is a cross-sectional view of an alternative version of the semiconductor integrated circuit chip package of FIG. 6.

FIG. 6 is a cross-sectional view of a semiconductor integrated circuit chip package according to another exemplary embodiment of the present invention. FIG. 7 is an alternative version of the semiconductor integrated circuit chip package of FIG. 6.

Referring to FIG. 6, a semiconductor integrated circuit chip package 600 according to the current embodiment includes three semiconductor integrated circuit chip bodies 601 mounted on the package substrate 405, as in the embodiment of FIG. 5. The embodiments of FIGS. 5 and 6 are different in a structure of electrode pads 602a and 602b of a semiconductor integrated circuit chip body 601 and a structure of a decoupling capacitor 603. The first and second electrode pads 602a and 602b are located on a top or bottom surface of the semiconductor integrated circuit chip body 601, not a side face thereof. The decoupling capacitor 603 includes four protrusions extending from its one side face. As shown in FIG. 6, the decoupling capacitor 603 having the four protrusions has a comb-like shape when viewed from the side. Thus, the decoupling capacitor 603 can be easily placed by inserting the protrusion in each space between the semiconductor integrated circuit chip bodies 601. A first or second external electrode is formed at each protrusion of the decoupling capacitor 603 to be properly connected with the first or second electrode pad 602a or 602b.

Referring to FIG. 7, a semiconductor integrated circuit chip package 600' which is an alternative version of a structure of FIG. 6 further includes a second decoupling capacitor 604 disposed at an opposing side of the decoupling capacitor 603 (hereinafter, also referred to as a first decoupling capacitor). The second decoupling capacitor 604 is structurally similar to the first decoupling capacitor 603, except that it has only two protrusions forming a clip-like structure. The clip-like structure facilitates the disposition of the second decoupling capacitor 604. As indicated above, a desired number of decoupling capacitors 603 and 604 may be disposed at the side of a stack of the plurality of semiconductor integrated circuit chip bodies 601. The decoupling capacitors 603 and 604 may have a comb or clip shape so that they can be easily placed at the stack.

An external electrode terminal may be further provided on a bottom face of the decoupling capacitor 603, that is, on a face of the decoupling capacitor 603 contacting the package substrate 405 so as to provide power to the semiconductor integrated circuit chip bodies 601 through the decoupling capacitor 603.

According to the present invention, a semiconductor integrated circuit chip can be achieved, which can maintain an impedance of a power distribution network below a target impedance in a wide frequency range, particularly, at a high frequency by minimizing an inductance between a decoupling capacitor and a semiconductor integrated circuit chip.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor integrated circuit chip comprising:
   a semiconductor integrated circuit chip body;
   an input/output terminal disposed on the outside of the semiconductor integrated circuit chip body; and
   a decoupling capacitor disposed at a side face of the semiconductor integrated circuit chip body and electrically connected to the input/output terminal,
   wherein the decoupling capacitor comprises a capacitor body including a stack of a plurality of dielectric layers, and first and second internal electrodes, the first and second internal electrodes having opposite polarities and alternating with each other, one of the plurality of dielectric layers being between each alternate set of the first and second internal electrodes, and
   having at least one protrusion extending from one side face of the dielectric layers and the first and second internal electrodes, a side face of the dielectric layers and the first and second internal electrodes facing the side face of the chip body are provided such that a top face or a bottom face of the protrusion covers a portion of the chip body, and external electrodes are disposed on the top face or the bottom face of the protrusion toward the chip body.

2. The semiconductor integrated circuit chip of claim 1, wherein the input/output terminal is placed at the side face of the semiconductor integrated circuit chip body at which the decoupling capacitor is disposed.

3. The semiconductor integrated circuit chip of claim 1, wherein the input/output terminal is disposed on at least one of top and bottom faces of the semiconductor integrated circuit chip body.

4. The semiconductor integrated circuit chip of claim 1, wherein the decoupling capacitor comprises:
   a capacitor body including therein a stack of a plurality of dielectric layers;
   first and second internal electrodes having opposite polarity and alternated with each other, with the dielectric layer between each alternate set of the first and second internal electrodes; and
   first and second external electrodes disposed on the outside of the capacitor body and respectively connected to the first and second internal electrodes.

5. The semiconductor integrated circuit chip of claim 4, wherein the first and second external electrodes are disposed in one direction on a side face of the capacitor body facing the semiconductor integrated circuit chip body, and are spaced apart from each other.

6. The semiconductor integrated circuit chip of claim 4, wherein the input/output terminal comprises first and second electrode pads electrically connected to the first and second external electrodes, respectively.

7. The semiconductor integrated circuit chip of claim 6, wherein the first and second electrode pads are disposed on both top and bottom faces of the semiconductor integrated circuit chip body.

8. The semiconductor integrated circuit chip of claim 7, wherein the first and second electrode pads on the same face are spaced apart from each other in a direction perpendicular to a direction from the semiconductor integrated circuit chip body toward the decoupling capacitor.

9. The semiconductor integrated circuit chip of claim 8, wherein the second electrode pad on the bottom face of the semiconductor integrated circuit chip body faces the first electrode pad on the top face of the semiconductor integrated circuit chip body.

10. The semiconductor integrated circuit chip of claim 8, wherein the plurality of dielectric layers are stacked in the same direction as a direction in which the first and second electrode pads are disposed.

11. The semiconductor integrated circuit chip of claim 5, wherein the first and second electrode pads are disposed on a top or bottom face of the semiconductor integrated circuit chip body.

12. The semiconductor integrated circuit chip of claim 11, wherein the first and second electrode pads are spaced apart from each other in a direction from the semiconductor integrated circuit chip body toward the decoupling capacitor.

13. A multilayer chip capacitor comprising:
   a capacitor body having a shape defined by top and bottom faces facing each other and side faces therebetween, and including therein a stack of a plurality of dielectric layers;
   first and second internal electrodes having opposite polarity and alternating with each other, with the dielectric layer between each alternate set of the first and second internal electrodes; and
   first and second external electrodes disposed on the outside of the capacitor body and electrically connected to the first and second internal electrodes, respectively,
   wherein the capacitor body includes at least one protrusion extending from one side face of the dielectric layers and the first and second internal electrodes, a side face of the dielectric layers and the first and second internal electrodes facing the side face of the chip body are provided such that a top face or a bottom face of the protrusion covers a portion of the chip body, and the first and second external electrodes are disposed on the top face or the bottom face of the protrusion toward the chip body.

14. The multilayer chip capacitor of claim 13, wherein the capacitor body includes one protrusion extending from the top face and the side face of the dielectric layers and the first and second internal electrodes, and the first and second external electrodes are disposed on a face facing a lower portion of the capacitor body among faces forming the protrusion.

15. The multilayer chip capacitor of claim 14, wherein the first and second external electrodes are spaced apart from each other in a direction from the protrusion toward the capacitor body.

16. The multilayer chip capacitor of claim 14, wherein the plurality of dielectric layers are stacked in a direction perpendicular to a direction in which the first and second external electrodes are disposed.

17. The multilayer chip capacitor of claim 13, wherein the capacitor body includes a first protrusion extending from the top face and the side face of the dielectric layers and the first and second internal electrodes, and a second protrusion extending from the bottom face and the side face of the dielectric layers and the first and second internal electrodes, and
- the first and second external electrodes are disposed on a face facing a lower portion of the capacitor body among faces forming the first protrusion and on a face facing an upper portion of the capacitor body among faces forming the second protrusion.

18. The multilayer chip capacitor of claim 17, wherein the first and second external electrodes at the first protrusion are spaced from each other in a direction perpendicular to a direction from the first protrusion toward the capacitor body, and
- the first and second external electrodes at the second protrusion are spaced apart from each other in a direction perpendicular to a direction from the second protrusion toward the capacitor body.

19. The multilayer chip capacitor of claim 18, wherein the second external electrode at the second protrusion faces the first external electrode at the first protrusion.

20. The multilayer chip capacitor of claim 18, wherein the plurality of dielectric layers are stacked in a direction in which the first and second external electrodes are disposed.

21. The multilayer chip capacitor of claim 13, wherein the capacitor body includes a plurality of protrusions extended from the dielectric layers and the first and second internal electrodes and disposed spaced apart from each other in one direction.

22. A semiconductor integrated circuit chip package comprising:
- a package substrate; and
- a semiconductor integrated circuit chip mounted on the package substrate and including a semiconductor integrated circuit chip body, an input/output terminal disposed on the outside of the semiconductor integrated circuit chip body, and a decoupling capacitor disposed at a side face of the semiconductor integrated circuit chip body and electrically connected to the input/output terminal,
- wherein the decoupling capacitor comprises a capacitor body including a stack of a plurality of dielectric layers, and first and second internal electrodes, the first and second internal electrodes having opposite polarities and alternating with each other, one of the plurality of dielectric layer being between each alternate set of the first and second internal electrodes, and
- having at least one protrusion extending from one side face of the dielectric layers and the first and second internal electrodes, a side face of the dielectric layers and the first and second internal electrodes facing the side face of the chip body are provided such that a top face or a bottom face of the protrusion covers a portion of the chip body, and external electrodes are disposed on the top face or the bottom face of the protrusion toward the chip body.

23. The semiconductor integrated circuit chip package of claim 22, wherein the semiconductor integrated circuit chip comprises a plurality of semiconductor integrated circuit chips stacked on top of each other on the package substrate.

24. The semiconductor integrated circuit chip package of claim 23, wherein the decoupling capacitor is a common decoupling capacitor electrically connected to at least two semiconductor integrated circuit chips of the plurality of semiconductor integrated circuit chips.

25. The semiconductor integrated circuit chip package of claim 23, wherein the decoupling capacitor includes:
- at least one protrusion extending from a side face of the decoupling capacitor facing the semiconductor integrated circuit chip body; and
- first and second external electrodes disposed at a face forming the protrusion and electrically connected to the input/output terminal.

26. The semiconductor integrated circuit chip package of claim 25, wherein the protrusion is placed in a space between an adjacent set of the semiconductor integrated circuit chips.

27. The semiconductor integrated circuit chip package of claim 22, further comprising an external electrode provided on one side of the decoupling capacitor and contacting a top face of the package substrate to be electrically connected with the package substrate,
- wherein the semiconductor integrated circuit chip body is electrically connected with the package substrate through the decoupling capacitor.

* * * * *